United States Patent [19]
Ikesugi et al.

[11] Patent Number: 5,605,464
[45] Date of Patent: Feb. 25, 1997

[54] IC PACKAGE CONNECTOR

[75] Inventors: Hiroshi Ikesugi, Yokohama, Japan; George M. Simmel, The Waterside, Singapore

[73] Assignee: Molex Incorporated, Lisle, Ill.

[21] Appl. No.: 216,223

[22] Filed: Mar. 22, 1994

[51] Int. Cl.[6] .................................................. H01R 9/09
[52] U.S. Cl. .............................................. 439/70; 439/68
[58] Field of Search ............................... 439/70, 525, 68

[56] References Cited

U.S. PATENT DOCUMENTS

| | | | |
|---|---|---|---|
| Re. 31,929 | 6/1985 | Donaher et al. | 439/70 X |
| Re. 33,268 | 7/1990 | Grabbe et al. | 439/70 |
| 4,362,353 | 12/1982 | Cobaugh et al. | 439/70 X |
| 4,464,832 | 8/1984 | Asick et al. | 439/68 X |
| 4,651,571 | 6/1987 | Petersen et al. | 439/261 |
| 4,679,871 | 7/1987 | Egawa | 439/70 |
| 4,729,739 | 3/1988 | Coffee et al. | 439/71 |
| 4,746,299 | 5/1988 | Matsuoka et al. | 439/70 |
| 4,799,897 | 1/1989 | Mogi et al. | 439/264 |

Primary Examiner—P. Austin Bradley
Assistant Examiner—Daniel Wittels
Attorney, Agent, or Firm—Charles S. Cohen

[57] ABSTRACT

An IC connector receives an IC package which includes a plurality of J-bend type leads arranged in parallel rows along opposite sides of an IC package body. The connector includes a housing having package-receiving recess and a pair of rows of terminal-receiving passages. A plurality of stamped and formed terminals are received in the passages. Each terminal includes a contact section for contacting a respective one of the leads of the IC package, a retention section for fixing the terminal in a respective one of the passages and a tail section exposed exteriorly of the housing. The contact section of each terminal is generally channel-shaped to define a pair of rigidifying side walls extending in planes generally transverse to the side walls of the housing and a central base portion joining the rigidifying the side walls. A pair of resilient cantilevered beam portions are formed from the central base portion of the contact section and define a pair of spring contacts projecting into the recess for engaging a respective one of the leads of the IC package.

18 Claims, 10 Drawing Sheets

1
IC PACKAGE CONNECTOR

FIELD OF THE INVENTION

This invention generally relates to the art of electrical connectors and, particularly, to a connector for an IC package and, further, to an improved terminal for an IC connector.

BACKGROUND OF THE INVENTION

IC packages typically are square or rectangular and have a large number of short, stiffly resilient terminals or leads spaced along two opposite sides or all four sides of the package. The IC package typically is mounted in a connector having a dielectric housing or insulating body with a package-receiving recess defined by at least two generally parallel opposite side walls or four walls surrounding the recess, along with a bottom wall which generally closes the recess. Terminal-receiving passages extend through the bottom wall along the inside of at least some of the side walls.

A commonly known IC package includes a plurality of J-bend type leads. The leads are arranged in parallel relation at the sides of a body of the IC package. The tip of each lead extends in the vertical direction and is bent inwardly in a generally U-shape.

The IC package with its J-bend type wires is inserted into the package-receiving recess of the connector housing, and the leads engage the plurality of terminals inside the side walls of the housing surrounding the recess. These IC connectors often are used as test sockets to conduct burn in tests on the IC packages. The burn in process typically requires that the assembly be exposed to a temperature of 120° C. for over 120 hours. If a single point of contact is made between each terminal of the test socket and a respective lead of the IC package, the main problem encountered is a phenomenon known as accelerated stress relaxation. While certain designs have been utilized to minimize this problem, the problem is more difficult to overcome with IC packages having the J-bend type lead wires.

In addition, some IC package manufacturers prefer to insert their IC packages into the IC connectors with the leads extending downward while other manufacturers prefer the leads to extend upward. In view of the alternative orientations, the manner of contacting the leads depends upon their orientation. Thus, while one terminal configuration may be desirable if the leads extend downward, a different configuration may be desirable if the leads extend upward. This can make the design of a desirable terminal that will perform well with packages of either orientation especially difficult.

The present invention is directed to providing the IC connector with terminals having two contact points with each lead of the IC package. The terminal design makes efficient use of the sheet metal from which it is stamped and formed and also permits the terminals to be gang-loaded into the terminal-receiving passages of the connector housing. In addition, it can be used with IC packages that are inserted with their leads extending up or down.

SUMMARY OF THE INVENTION

An object, therefore, of the invention is to provide a new and improved IC connector for an IC package.

Another object of the invention is to provide such a connector for an IC package which includes a plurality of J-bend type leads arranged in parallel rows along at least two opposite sides of an IC package body. Each lead includes a vertical portion and a bent portion at each end thereof extending into the body.

A further object of the invention is to provide a new and improved terminal in an IC connector for an IC package.

In the exemplary embodiment of the invention, the connector includes a housing having a package-receiving recess defined by generally parallel opposite side walls, a bottom wall and a row of terminal-receiving passages extending through the bottom wall along the inside of each side wall. A plurality of stamped and formed terminals are received in the passages. Each terminal includes a contact section for contacting a respective one of the lead wires of the IC package, a retention section for fixing the terminal in a respective one of the passages and a tail section exposed exteriorly of the housing.

The invention contemplates that the contact section of each terminal is generally channel-shaped to define a pair of rigidifying side walls extending in planes generally transverse to the side walls of the housing, and a central base portion joining the rigidifying side walls. A pair of resilient cantilevered beam portions are formed from the central base portion. The beam portions define a pair of spring contacts projecting into the recess for engaging a respective one of the lead wires of the IC package.

More particularly, in one form of one embodiment of the invention, the pair of resilient cantilevered beam portions include a first beam portion extending upwardly and inwardly and terminating in a respective spring contact. A second beam portion extends upwardly and then downwardly and inwardly and terminates in a respective spring contact. In a second form, the first beam portion extends downwardly and then upwardly and inwardly and terminates in a respective spring contact. In both forms, the retention section of each terminal is generally channel-shaped to define a pair of retaining side walls spaced from but generally parallel to the rigidifying side walls of the contact section, and a central base portion formed as a continuation of the central base portion of the contact section.

In an alternate embodiment of the invention, the retention section is formed by a base portion of the stamped and formed terminal, with a resilient portion bent upwardly to a position spaced from the base portion to define a box-like retention section of the terminal.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENTS

Figure 1:
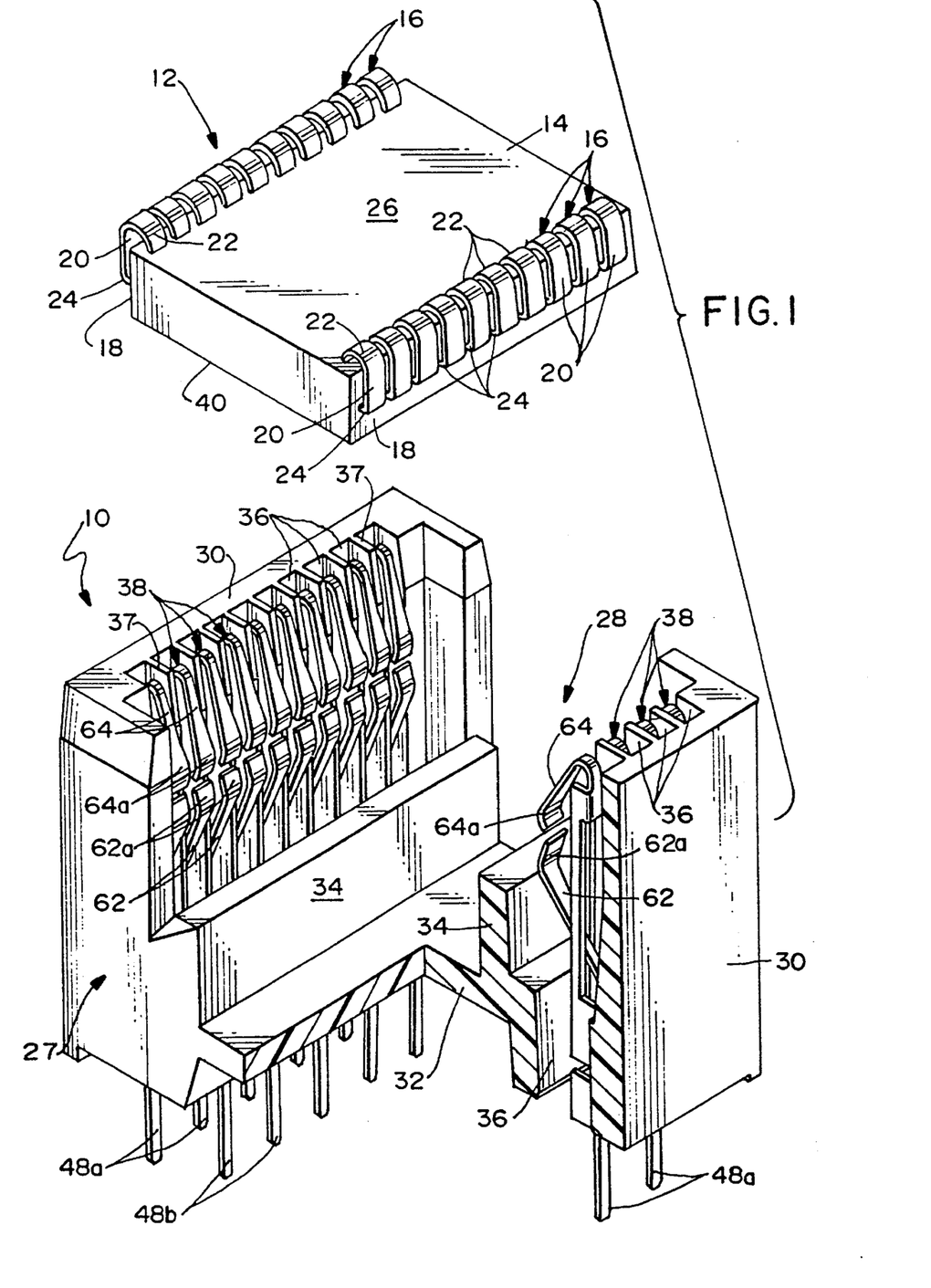
FIG. 1 is an exploded perspective view, partially cutaway, of an IC connector and an IC package, the connector embodying the concepts of the invention.
Figure 2:
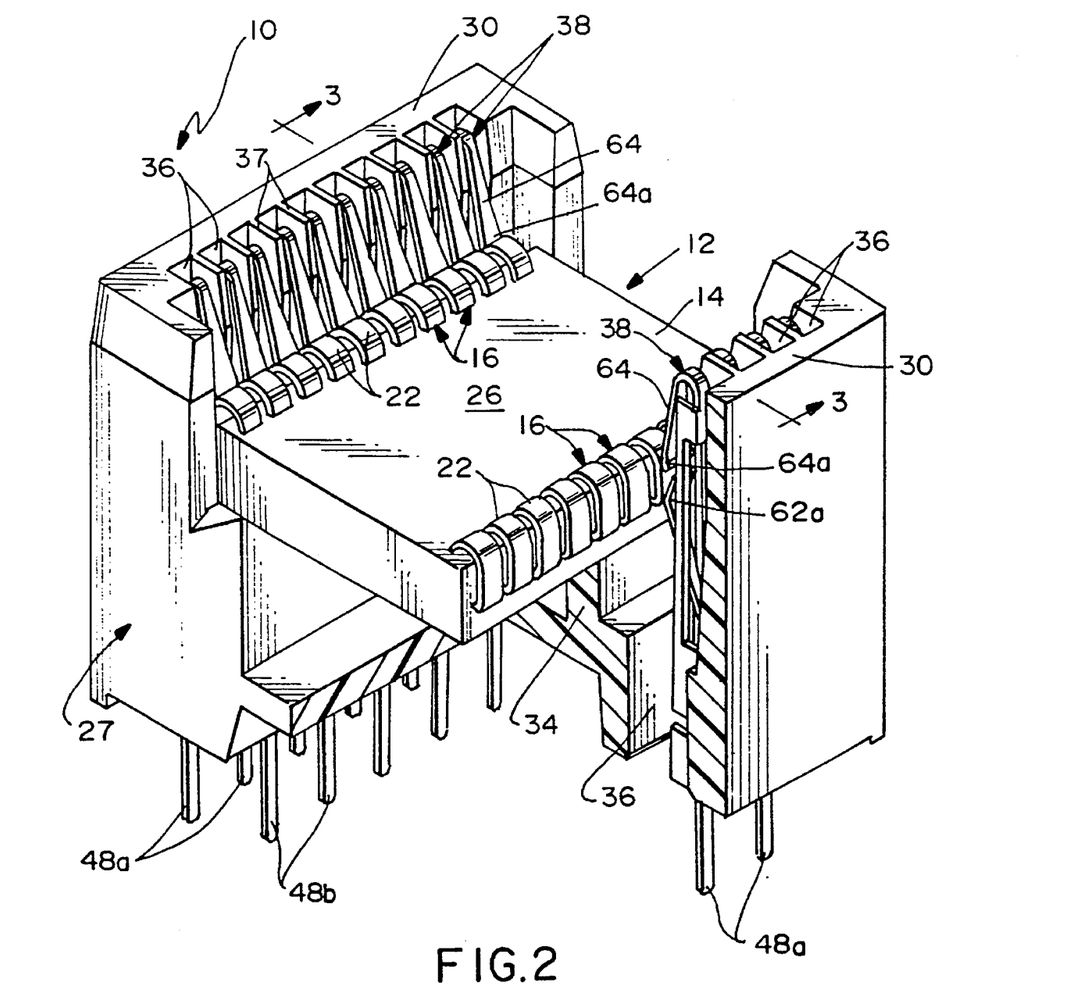
FIG. 2 is a view similar to that of FIG. 1, with the IC package inserted into the connector.
Figure 3:
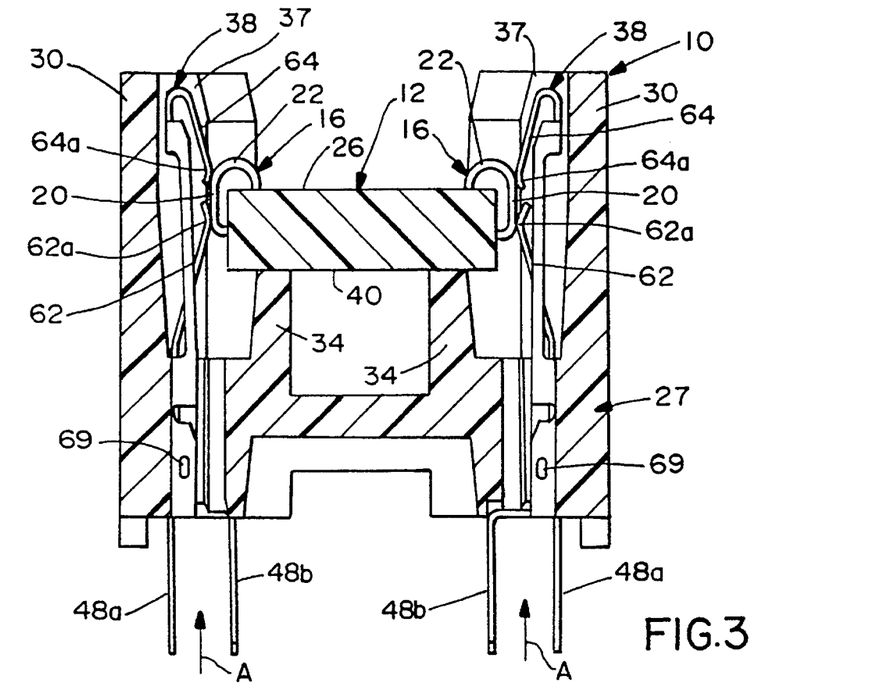
FIG. 3 is a vertical section taken generally along line 3—3 of FIG. 2.

Referring to the drawings in greater detail, and first to FIGS. 1–3, The invention is embodied in an IC connector, generally designated 10, for receiving an IC package, generally designated 12. The IC package includes a square or rectangular body 14 having a plurality of J-bend type leads, generally designated 16, arranged in parallel rows along opposite sides 18 of body 14. Each lead wire includes a vertical portion 20 and a pair of bent portions 22 and 24 at opposite ends of the vertical portion and extending toward body 14. Bent portion 24 extends out of IC package 12 horizontally and curves to a vertical orientation. Bent portion 22 is generally U-shaped so that vertical portion 20 and bent portion 22 form a "J" configuration with bent portion 22 extending over a flat side 26 of body 14 between opposite sides 18.

Connector 10 includes a housing, generally designated 27, which has a package-receiving recess, generally designated 28, defined by generally parallel opposite side walls 30 and a bottom wall 32. A pair of IC package supports 34 project upwardly from bottom wall 32, as best seen in FIG. 3. A row of terminal-receiving passages 36 extend through bottom wall 32 along the inside of each side wall 30. Such passages 36 are laterally defined by webs 37 that project horizontally from each sidewall 30 towards the opposite sidewall. A plurality of stamped and formed terminals, generally designated 38, are received in passages 36.

Figure 4:
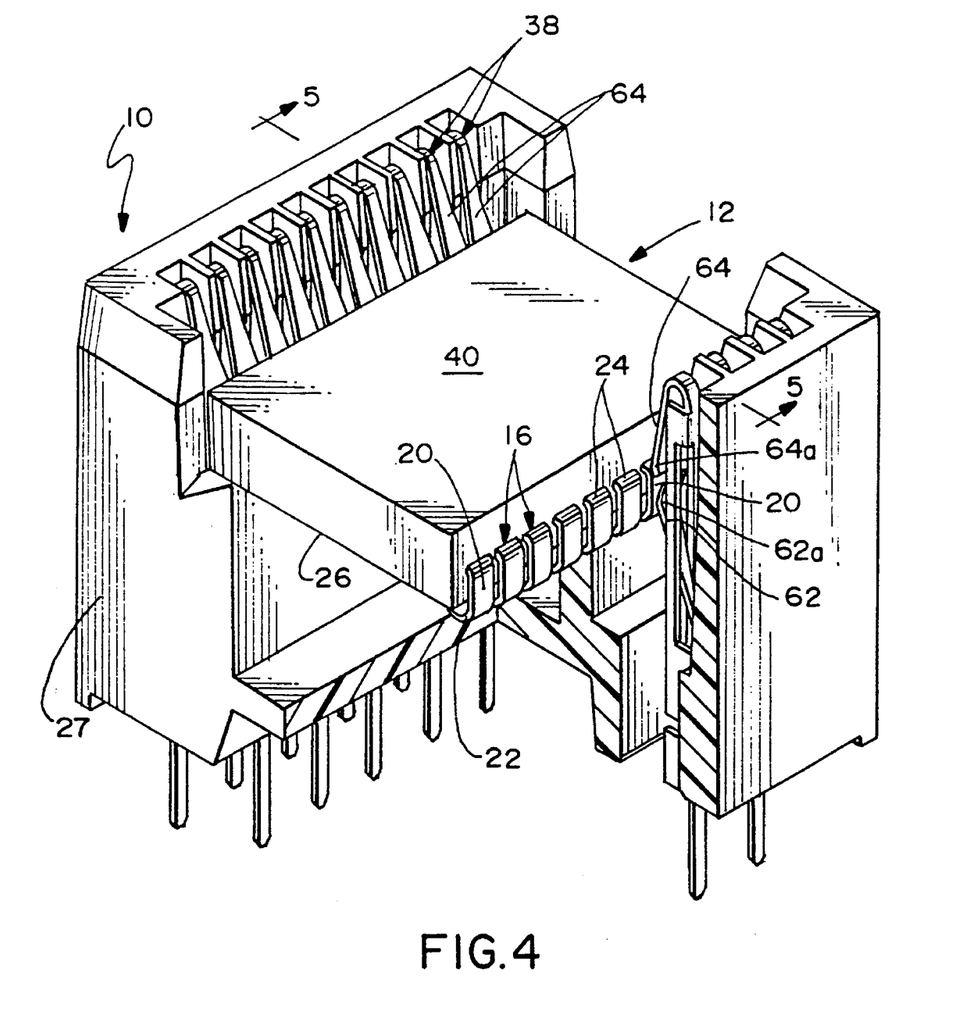
FIG. 4 is a view similar to that of FIG. 2, but of an embodiment of an IC connector for accommodating the IC package inverted in relation to its position in relation to FIGS. 1–3.
Figure 5:
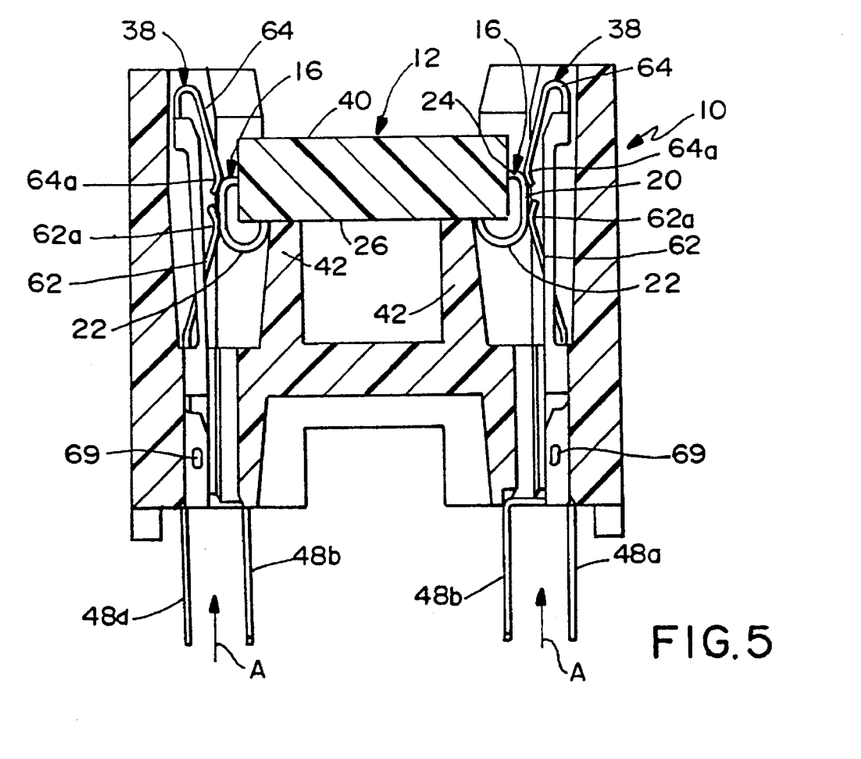
FIG. 5 is a vertical section taken generally along line 5—5 of FIG. 4.

Before proceeding with a detailed description of terminals 38, it should be noted that IC package 12 is inserted into recess 28 of IC connector 10 in FIGS. 1-3, with the J-bends of leads 16 of the package facing upwardly. Therefore, a flat side 40 of the IC package rests on top of IC package supports 34 as best seen in FIG. 3. Now, reference is made to FIGS. 4 and 5 wherein it can be seen that the IC package has been turned upside down and inserted into the IC connector. In this orientation, the J-bends 22 of the lead wires of the IC package project downwardly and flat side 26 of the IC package now rests on top of longer IC package supports 42. The only difference between the IC connector shown in FIGS. 1–3 and that shown in FIGS. 4 and 5 is the length of supports 42 versus the shorter supports 34. Otherwise the connectors, including terminals 38, are identical and the same reference numerals have been applied in FIGS. 4 and 5 corresponding to the same components described above in relation to the embodiment of FIGS. 1–3.

As stated above, terminals 38 are disposed in passages 36 in connector housing 27. The terminals are in rows along opposite sides of recess 28. However, the terminals alternate in each row to have different tail configurations (described hereinafter) so that the tails project from the housing in a staggered array of two rows on each side thereof as best seen in FIGS. 3 and 5.

Figure 6A:
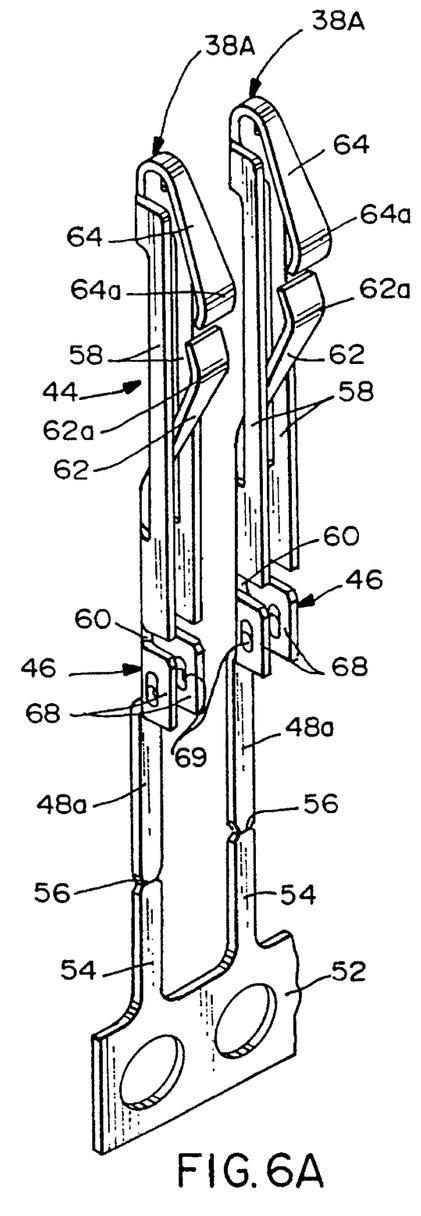
FIG. 6A is a perspective view of a pair of "in-line" terminals after they have been stamped and formed but still connected to the carrier web.
Figure 6B:
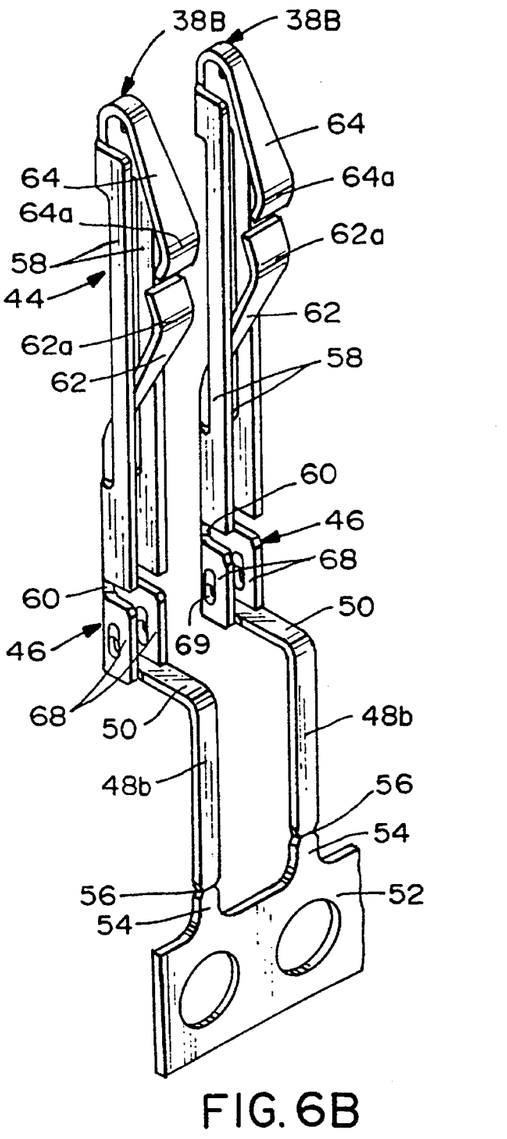
FIG. 6B is a view similar to that of FIG. 6A but of a pair of "off-set" terminals.

More particularly, referring to FIGS. 6A and 6B, a pair of "in-line" terminals 38A are shown in FIG. 6A, and a pair of "off-set" terminals 38B are shown in FIG. 6B. In-line terminals 38A form the two extreme outside rows of terminal tails as viewed in FIGS. 3 and 5, and off-set terminals 38B form the two innermost rows of terminal tails as seen in those illustrations. Otherwise, except for the tail portions of the terminals, the configurations of terminals 38A and 38B are identical and like reference numerals will be applied in their description, below.

Specifically, each terminal 38 (38A or 38B) includes a contact section, generally designated 44, for contacting a respective one of leads 16 of IC package 12, and a tail section 48a for terminal 38A and 48b for terminal 38B, and a retention section, generally designated 46, between such contact section and the tail section for fixing the terminal in a respective one of passages 36 of connector housing 27. It can be seen in FIGS. 6A and 6B that tail sections 48a for in-line terminals 38A are "straight" and tail sections 48b for terminals 38B are bent to form an off-set portion 50 which off-sets the tail portions 48b inwardly with respect to connector housing 27. FIGS. 6A and 6B also show that the terminals are connected to carrier strips 52 having web portions 54 which facilitate gang-loading the terminals into passages 36 of connector housing 27 from the bottom thereof as indicated by arrows "A" in FIGS. 3 and 5. The terminals as shown on the carrier strips 52 are spaced apart a distance equal to twice the distance between the terminals in the housing. Thus, the terminals 38A of the first set are gang-loaded into every other terminal-receiving passage 36 and then the terminals 38B of the second set are gang-loaded into the remaining passages 36. After loading, the carrier web portions are broken away from the terminals at weakened areas 56 between the tail portions and web portions.

Each contact section 44 of each terminal 38 (38A or 38B) is generally channel-shaped to define a pair of rigidifying side walls 58 extending in planes generally transverse to side walls 30 of connector housing 27. A central base portion 60 of the channel-shaped contact section joins rigidifying side walls 58 in a generally U-shaped cross-sectional configuration. A pair of resilient cantilevered beam portions 62 and 64 are formed from central base portion 60 to define a pair of spring contacts 62a and 64a, respectively, which project into recess 28 of connector housing 27 for engaging respective ones of lead wires 16 of IC package 12.

In essence, resilient cantilevered beam portion 62 forms a first beam portion extending upwardly and inwardly and terminating in spring contact 62a as seen in FIGS. 6A and 6B. Cantilevered beam portion 64 forms a second beam portion which extends upwardly and then downwardly and inwardly and terminates in spring contact 64. FIGS. 3 and 5 show these configurations of cantilevered beam portions 62 and 64 and how spring contacts 62a and 64a redundantly engage leads 16 of IC package 12.

Referring to FIG. 3, it can be seen that lower spring contact 62a exerts a generally horizontal force on the vertical portion 20 of J-lead 16. The upper spring contact 64a contacts an upwardly facing portion of U-shaped bent portion 22 so that at least part of the force exerted by the upper spring contact on the J-lead 16 is downward to hold the IC package 12 in socket 10. In FIG. 5, lower spring contact 62a continues to exert a horizontal force on J-lead 16 and upper spring contact 64a exerts a force that, at least in part, is downward. However, upper spring contact 64a contacts the bent portion 24 of J-lead rather than U-shaped portion 22.

Figure 7:
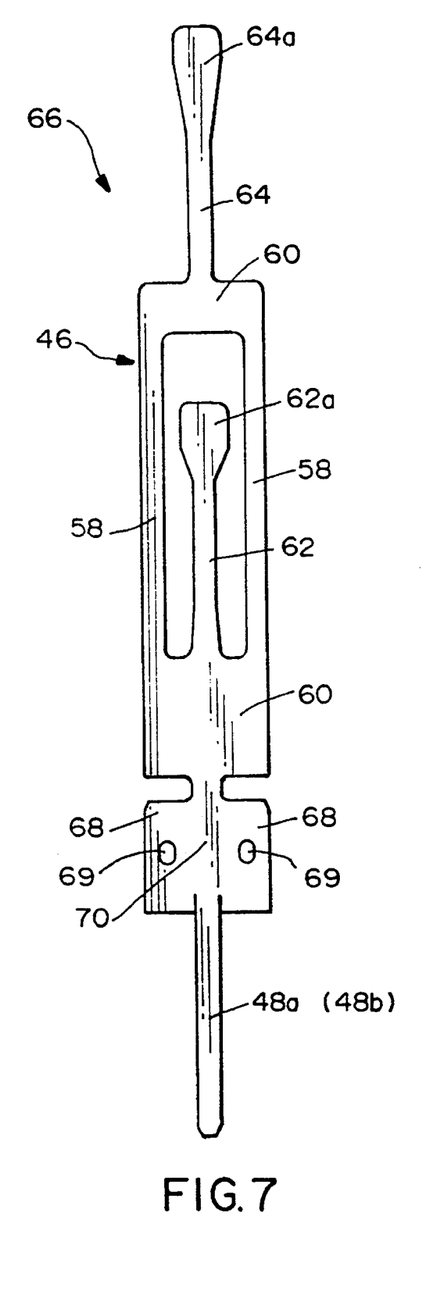
FIG. 7 is a plan view of a stamped blank from which one of the terminals in FIG. 6A is formed.

Reference now is made to FIG. 7 in relation to FIG. 6A. A stamped blank, generally designated 66, is shown in FIG. 7 and from which a terminal is formed. The portions of blank 66 from which rigidifying side walls 58 and cantilevered beam portions 62 and 64, along with spring contacts 62a and 64a, are formed have been identified by corresponding reference numerals. It can be seen that, by forming the cantilevered beam portions from central base portion 60, a very efficient use of the stamped sheet metal is made.

Referring back to FIGS. 6A and 6B, along with FIG. 7, retention section 46 of each terminal is generally channel-shaped to define a pair of retaining side walls 68 spaced from but generally parallel to rigidifying side walls 58 of contact section 44. A central base portion 70 (see FIG. 7) joins side walls 68 and is formed as a continuation of central base portion 60 of contact section 44. An embossment 69 is formed on sidewalls 68 to assist in retaining the terminals in housing 30. Repeating the desire to make very efficient use of the metal from which the terminals are stamped and formed, particular reference is made to FIG. 7 wherein it can be seen that base portion 60 and cantilevered beam portions 62 and 64 of contact section 44, base portion 70 of retaining section 46, and tail section 48a (48b) all are in a line longitudinally of the stamped blank from which the terminal is formed.

Figure 8:
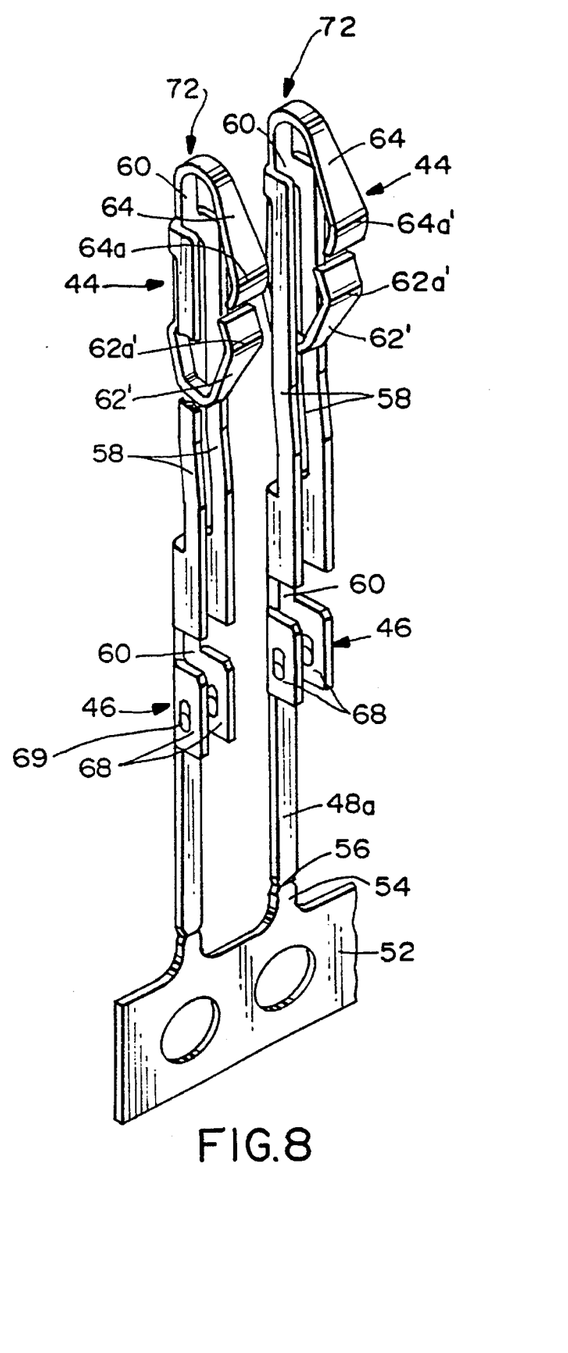
FIG. 8 is a fragmented, perspective view of a pair of stamped and formed terminals somewhat similar to those shown in FIG. 6A, but of a different design.

FIG. 8 shows an alternative design of a terminal, generally designated 72, which is substantially identical to terminals 38A and 38B, except for the configuration or formation of the lower or first cantilevered beam portions. Like numerals have been applied in FIG. 8 to identify like components described above in relation to FIG. 6A in order to simplify the description for better understanding thereof. A portion of one of sidewalls 58 has been fragmented in FIG. 8 so that it can be seen that a first cantilevered beam portion 62' has been bent downwardly and then back upwardly and inwardly to terminate in a spring contact 62a'. Cantilevered beam portion 64 and its spring contact 64a are formed identically to that described above in relation to FIGS. 6A–7. As with terminals 38A and 38B, cantilevered beam portion 62' of terminal 72 is formed from the central portion 60 of the terminal to make efficient use of the metal from which the terminal is stamped and formed.

Figure 9:
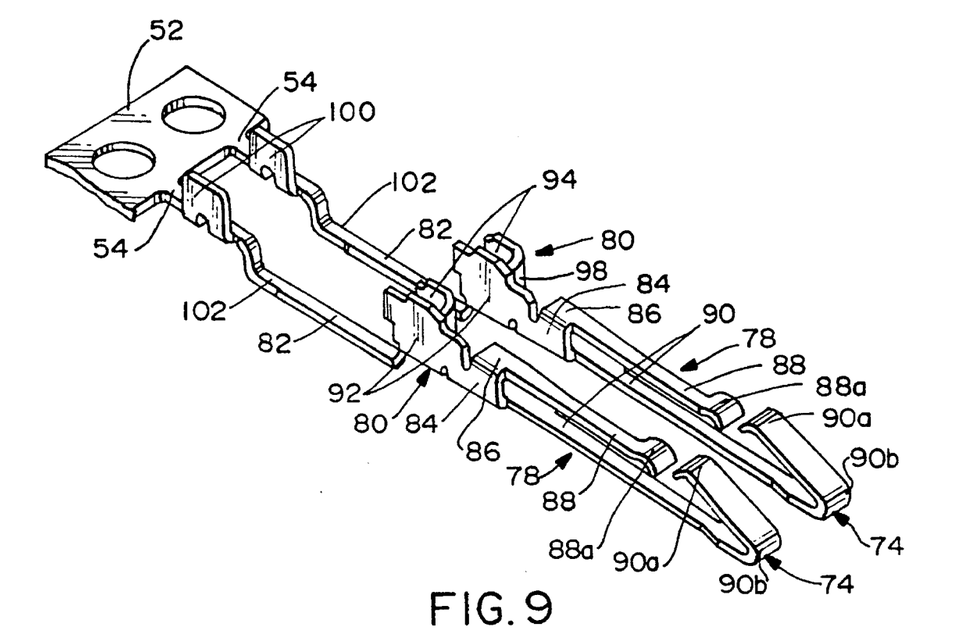
FIG. 9 is a perspective view of a pair of stamped and formed "in-line" terminals, according to an alternate embodiment of the invention.
Figure 10:
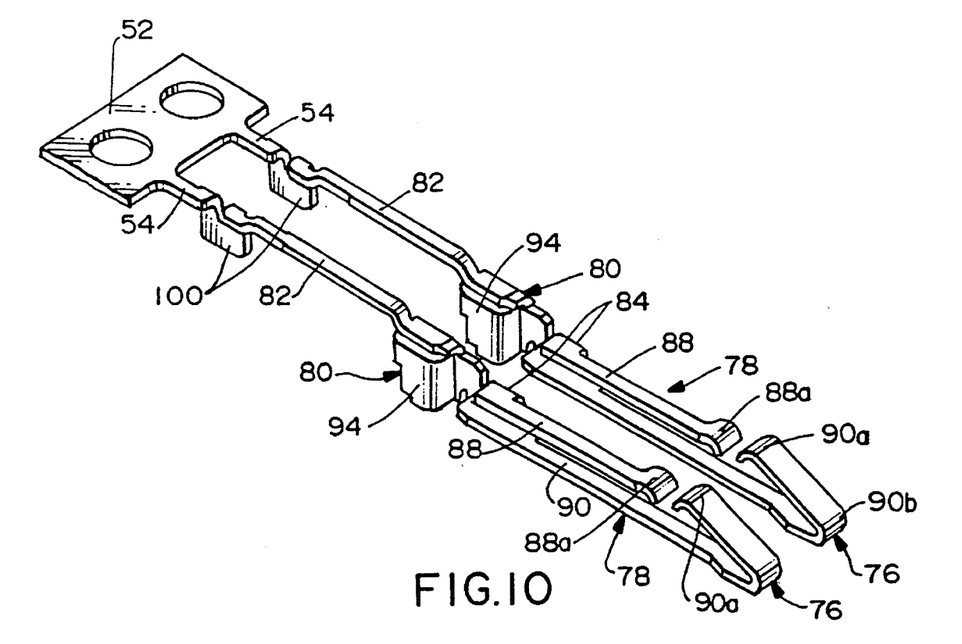
FIG. 10 is a view similar to that of FIG. 9, but of a pair of "off-set" terminals.
Figure 11:
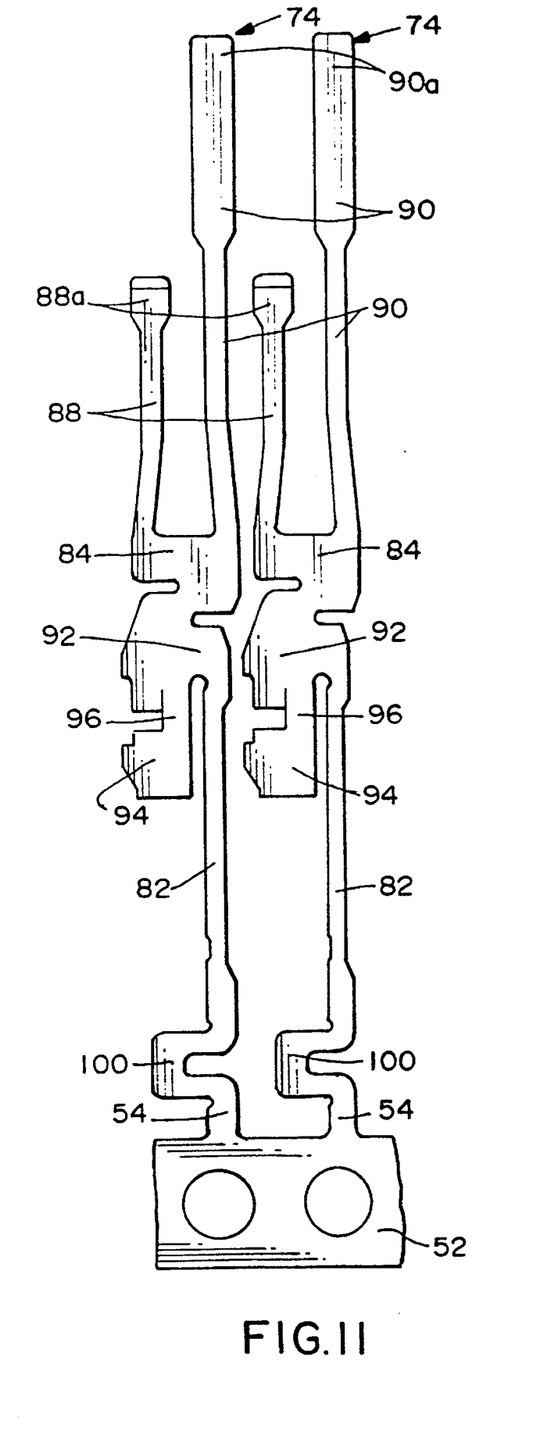
FIG. 11 is a plan view of a stamped blank from which the in-line terminals of FIG. 9 are formed.
Figure 12:
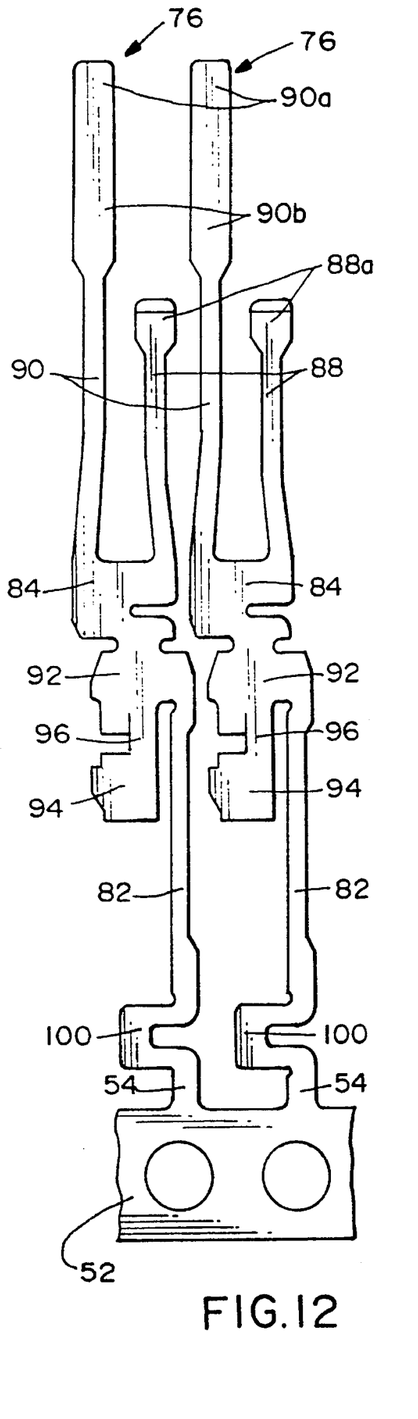
FIG. 12 is a plan view of a stamped blank from which the off-set terminals of FIG. 10 are formed.

FIGS. 9–15 show an alternate embodiment of the invention, particularly in the construction of the terminals. More particularly, FIG. 9 shows a pair of stamped and formed "in-line" terminals, generally designated 74, and FIG. 10 shows a pair of "off-set" terminals, generally designated 76. Again, the terminals are substantially identical except for their tail sections. The terminals are shown in FIGS. 9–14 still attached to carrier strip 52 and webs 54 which facilitate gang-loading the terminals into the IC connector (described hereinafter).

Each of terminals 74 or 76 includes a contact section, generally designated 78, a retention section, generally designated 80, and a tail section 82, all for purposes described above in relation to terminals 38 (38A or 38B).

Each contact section 78 includes a base portion 84 which has a U-shaped cross-sectional configuration to define side wall portions 86. A first resilient cantilevered beam portion 88 extends upwardly from one of the side wall portions and inwardly to define a spring contact 88a. A second resilient cantilevered beam portion 90 projects upwardly and then downwardly and inwardly at 90b and ends adjacent a spring contact 90a. Therefore, again, each terminal 74 (or 76) defines a redundant pair of contacts 88a and 90a for engaging a respective one of lead wires 16 of IC package 12.

Figure 13:
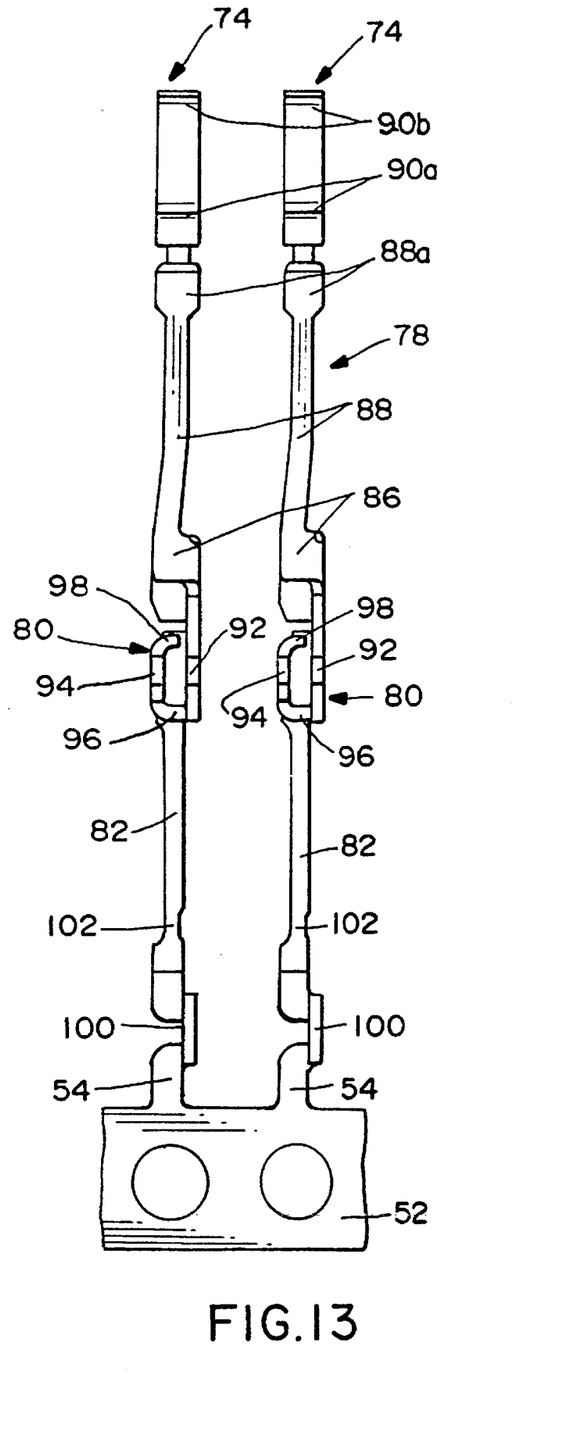
FIG. 13 is a side elevational view of the pair of in-line terminals of FIG. 9.
Figure 14:
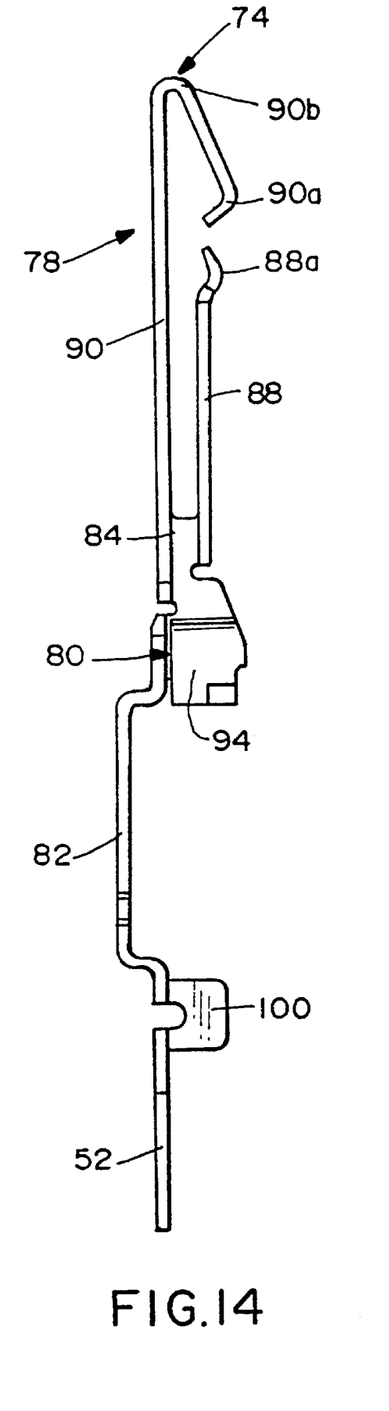
FIG. 14 is a side elevational view looking toward the left-hand side of FIG. 13.

Retention section 80 of each terminal 74 or 76 has a generally box-like configuration. Each retention section includes a pair of side wall portions 92 and 94 joined by a base portion 96 which is best seen in FIG. 13. Tail section 82 is integral with an edge of side wall portion 92 at a right-angle thereto. Side wall portion 94 has an inwardly turned lip 98 bent toward the opposite side wall portion 92 to form a substantial rigidifying structure. As with terminals 38A and 38B, lower contact 88a provides a substantially horizontal contact force while upper contact 90a provides at least some downward vertical force to hold the IC package within the socket.

FIGS. 9–14 also show that the stamped blanks (FIGS. 11 and 12) and the stamped and formed blanks (FIGS. 9, 10, 13 and 14) all have ears 100 which simply are provided to assist in the forming process. Again, as with terminals 38A and 38B, terminals 74 and 76 are stamped and formed at twice the spacing of the terminal-receiving passages to permit gang-loading of the terminals. The terminals are broken from carrier strip 52, webs 54 and ears 100, as at 102, after the terminals are gang-loaded into terminal-receiving passages 36 of connector housing 27 in the direction of arrows "A" in FIG. 15.

Figure 15:
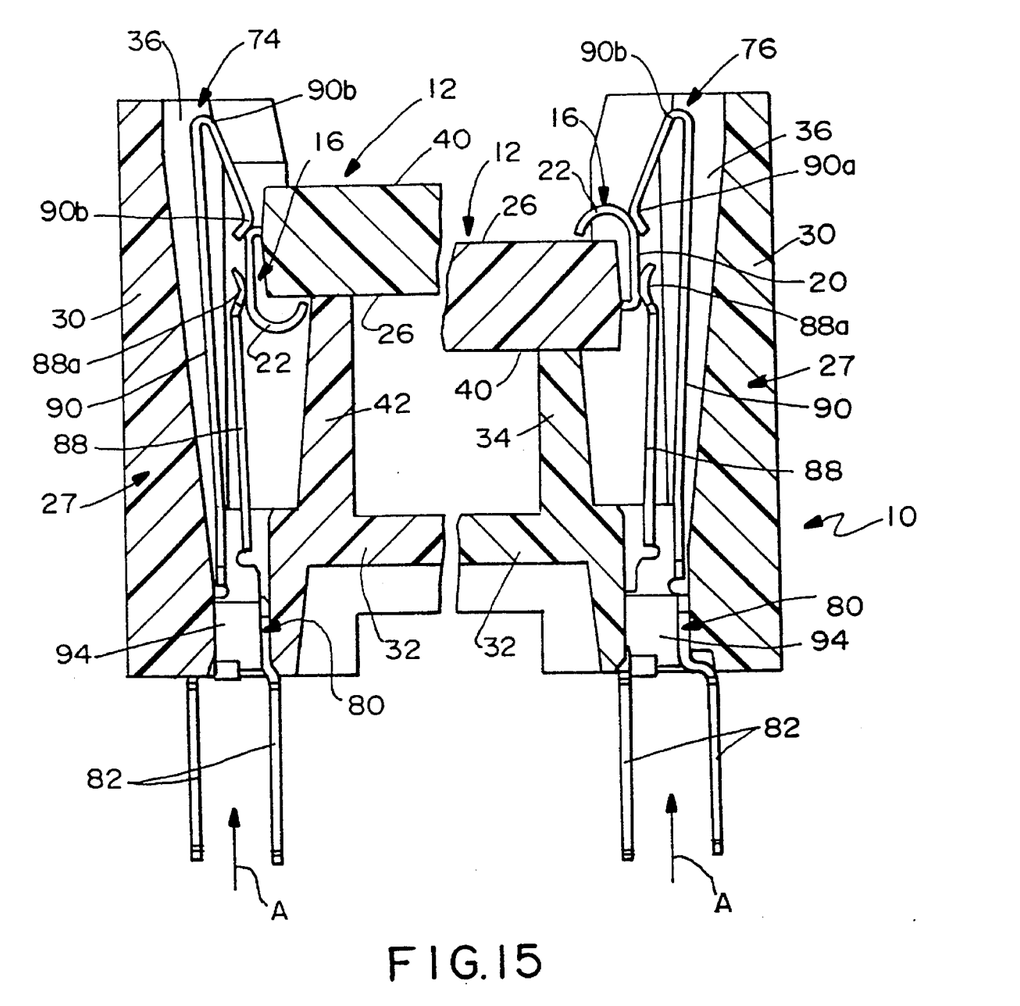
FIG. 15 is a composite vertical section of two different forms of connector housings utilizing the same terminals of FIGS. 9–14, but illustrating different bottom wall configurations of the housings for receiving the IC package in different orientations.

Lastly, FIG. 15 is a composite of two different housing configurations in which terminals 74 and 76 are mounted, the two housings differing only by the lengths of standoffs 34 and 42 for accommodating different inserting orientations of IC package 12. In other words, the right-hand half of FIG. 15 shows the IC package inserted with the J-bends 22 of leads 16 facing upwardly, with the IC package resting on top of shorter standoffs 34. The left-hand half of FIG. 15 shows the J-bends 22 of leads 16 facing downwardly, with the IC package resting on top of longer standoffs 42. Otherwise, the components of the connector housing, the terminals and the IC package are the same on either side of the composite depiction of FIG. 15.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. In an IC connector for an IC package which includes a plurality of J-bend type leads arranged in parallel rows along opposite sides of an IC package body, each lead including a vertical portion and a bent portion at each end thereof extending toward the body, the connector including a housing having a package-receiving recess defined by generally parallel opposite side walls, a bottom wall and a row of terminal-receiving passages extending through the bottom wall and along the inside of each of said side walls, and a plurality of stamped and formed terminals received in said passages, each of said terminals including a contact section for contacting a respective one of the leads of the IC package, a retention section for fixing the terminal in a respective one of the passages and a tail section exposed exteriorly of the housing, wherein the improvement comprises said contact section of each said terminal having a generally channel-shaped cross-section to define a pair of rigidifying side walls extending in planes generally transverse to the side walls of the housing and a central base portion joining the rigidifying side walls, and a pair of resilient cantilevered beam portions formed from said central base portion and defining a pair of spring contacts projecting into said recess toward respective one of the leads of the IC package.

2. In an IC connector as set forth in claim 1, wherein said pair of resilient cantilevered beam portions includes a first beam portion formed from sheet metal material of said central base portion between said side walls.

3. In an IC connector as set forth in claim 2, wherein said first beam portion extends upwardly and inwardly and terminates in a first spring contact.

4. In an IC connector as set forth in claim 2, wherein said pair of resilient cantilevered beam portions includes a second beam portion extending upwardly and then downwardly and inwardly and terminating in a second spring contact.

5. In an IC connector as set forth in claim 1, wherein said retention section of each terminal has a generally channel-shaped cross-section to define a pair of retaining side walls spaced from but generally parallel to the rigidifying side walls of the contact section and a central base portion joining the side walls and formed as a continuation of the central base portion of the contact section.

6. In an IC connector as set forth in claim 1, wherein said pair of resilient cantilevered beam portions includes a first beam portion extending downwardly and then upwardly and inwardly and terminating in a first spring contact.

7. In an IC connector as set forth in claim 6, wherein said pair of resilient cantilevered beam portions includes a second beam portion extending upwardly and then downwardly and inwardly and terminating in a second spring contact.

8. In an IC connector for an IC package which includes a plurality of leads arranged in parallel rows along opposite sides of an IC package body, the connector including a housing having a package-receiving recess and parallel rows of terminal-receiving passages, and a plurality of stamped and formed terminals received in said passages, each of said terminals including a contact section for contacting a respective one of the leads of the IC package, wherein the improvement comprises said contact section of each of said terminals having a generally U-shaped cross-section to define a pair of side walls and a central base portion joining the side walls, and a pair of resilient cantilevered beam portions formed from said central base portion and defining a pair of spring contacts for engaging a respective one of the leads of the IC package.

9. In an IC connector as set forth in claim 8, wherein said pair of resilient cantilevered beam portions includes a first beam portion formed from sheet metal material of said central base portion between said side walls.

10. In an IC connector as set forth in claim 9, wherein said first beam portion extends upwardly and inwardly and terminates in a first spring contact.

11. In an IC connector as set forth in claim 10, wherein said pair of resilient cantilevered beam portions includes a second beam portion extending upwardly and then downwardly and inwardly and terminating in a second spring contact.

12. In an IC connector as set forth in claim 8, wherein each terminal includes a retention section having a generally U-shaped cross-section defined by a pair of retaining side walls and a central base portion joining the side walls.

13. In an IC connector as set forth in claim 8, wherein said pair of resilient cantilevered beam portions include a first beam portion extending downwardly and then upwardly and inwardly and terminating in a respective spring contact.

14. In an IC connector as set forth in claim 13, wherein said pair of resilient cantilevered beam portions include a second beam portion extending upwardly and then downwardly and inwardly and terminating in a respective spring contact.

15. In an IC connector for an IC package which includes a plurality of J-bend type leads arranged in parallel rows along opposite sides of an IC package body, each lead including a vertical portion and a bent portion at each end thereof extending toward the body, the connector including a housing having a package-receiving recess defined by generally parallel opposite side walls, a bottom wall and a row of terminal-receiving passages extending along the inside of each of said side walls, and a plurality of stamped and formed terminals received in said passages, each of said terminals including a contact section for contacting a respective one of the leads of the IC package, a retention section for fixing the terminal in a respective one of the passages and a tail section exposed exteriorly of the housing, said contact section having a pair of generally planar resilient cantilevered beam portions connected by a generally planar contact base, said contact base being generally perpendicular to the respective planes of said beam portions;

wherein the improvement comprises said retention section being separate from said contact section and having a generally box-shaped configuration to separate said tail section from said contact section, said retention section including a pair of side wall portions joined by a retention base portion, one of the side wall portions being generally planar and lying in the same plane as said contact base.

16. In an IC connector as set forth in claim 15, wherein the other of said side wall portions has an inwardly-turned lip bent toward said one side wall portion and spaced from said retention base portion.

17. In an IC connector as set forth in claim 16, wherein the tail section extends from an edge of one of said side wall portions of the retention section.

18. In an IC connector as set forth in claim 17, wherein at least a portion of said tail section is generally planar and the plane of said tail section is generally perpendicular to the plane of said contact base.

* * * * *